United States Patent
Aoshima et al.

(10) Patent No.: US 9,050,780 B2
(45) Date of Patent: Jun. 9, 2015

(54) LAMINATE BODY, LAMINATE PLATE, MULTILAYER LAMINATE PLATE, PRINTED WIRING BOARD, AND METHOD FOR MANUFACTURE OF LAMINATE PLATE

(71) Applicant: HITACHI CHEMICAL COMPANY, LTD., Tokyo (JP)

(72) Inventors: Masahiro Aoshima, Ibaraki (JP); Yoshihiro Takahashi, Ibaraki (JP); Yuka Yamazaki, Saitama (JP); Yasuo Kamigata, Ibaraki (JP); Hikari Murai, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 222 days.

(21) Appl. No.: 13/624,152

(22) Filed: Sep. 21, 2012

(65) Prior Publication Data
US 2013/0180765 A1   Jul. 18, 2013

Related U.S. Application Data

(60) Provisional application No. 61/537,859, filed on Sep. 22, 2011.

(30) Foreign Application Priority Data

Sep. 12, 2012   (JP) .................. 2012-200954

(51) Int. Cl.
| | |
|---|---|
| B32B 7/02 | (2006.01) |
| B32B 17/10 | (2006.01) |
| H05K 1/03 | (2006.01) |
| B32B 17/06 | (2006.01) |

(52) U.S. Cl.
CPC ............. *B32B 17/10036* (2013.01); *B32B 7/02* (2013.01); *B32B 17/1055* (2013.01); *B32B 17/10871* (2013.01); *B32B 17/101* (2013.01); *H05K 1/0306* (2013.01); *Y10T 428/24967* (2015.01); *B32B 17/061* (2013.01); *B32B 17/10614* (2013.01); *B32B 17/10697* (2013.01); *B32B 2262/0238* (2013.01); *B32B 2262/0269* (2013.01); *B32B 2262/0276* (2013.01); *B32B 2262/101* (2013.01); *H05K 1/036* (2013.01); *B32B 2260/021* (2013.01); *B32B 2264/10* (2013.01); *B32B 2457/08* (2013.01)

(58) Field of Classification Search
CPC   B32B 17/10036; B32B 7/02; B32B 17/1055; B32B 17/10871; B32B 17/101; H05H 1/0306
USPC .......... 174/255; 428/426, 215, 432, 428, 430, 428/435, 422, 417, 425.6, 441, 429, 436; 156/307.7, 285
See application file for complete search history.

(56) References Cited

U.S. PATENT DOCUMENTS

| | | | | |
|---|---|---|---|---|
| 4,710,420 | A  * | 12/1987 | Tonoki et al. | ................. 428/212 |
| 2003/0010530 | A1 | 1/2003 | Scheel et al. | |
| 2004/0025333 | A1 | 2/2004 | Hirose et al. | |
| 2005/0016764 | A1 * | 1/2005 | Echigo et al. | ................. 174/256 |
| 2010/0283004 | A1 * | 11/2010 | Lee et al. | ................. 252/299.65 |
| 2010/0327737 | A1 * | 12/2010 | Hayashi et al. | ............... 313/504 |

FOREIGN PATENT DOCUMENTS

| | | | | |
|---|---|---|---|---|
| JP | 2000-243864 | | 9/2000 | |
| JP | 2001060706 | * | 3/2001 | ............. H01L 31/04 |
| JP | 2001060706 A | * | 3/2001 | ............. H01L 31/04 |
| JP | 2004149736 A | * | 5/2004 | ............. C08G 10/02 |
| JP | 2004149763 | * | 5/2004 | ............. C08G 10/02 |
| JP | 2004149763 A | * | 5/2004 | ............. C08G 10/02 |
| JP | 2004-182851 | | 7/2004 | |

* cited by examiner

*Primary Examiner* — Timothy Thompson
*Assistant Examiner* — Charles Pizzuto
(74) *Attorney, Agent, or Firm* — Fitch, Even, Tabin & Flannery LLP

(57) ABSTRACT

A laminate body containing one or more resin composition layers and two or more glass substrate layers, wherein at least one layer of those resin composition layers is between glass substrate layers, and is a fiber-containing resin composition layer of a composition that contains a thermosetting resin and a fibrous base material. A laminate plate containing one or more cured resin layers and two or more glass substrate layers, wherein at least one layer of those cured resin layers is between glass substrate layers, and is a fiber-containing cured resin layer of the fiber-containing resin composition. A printed wiring board having the above-mentioned laminate plate and a wiring provided on the surface thereof. A method for producing the laminate plate.

18 Claims, 1 Drawing Sheet

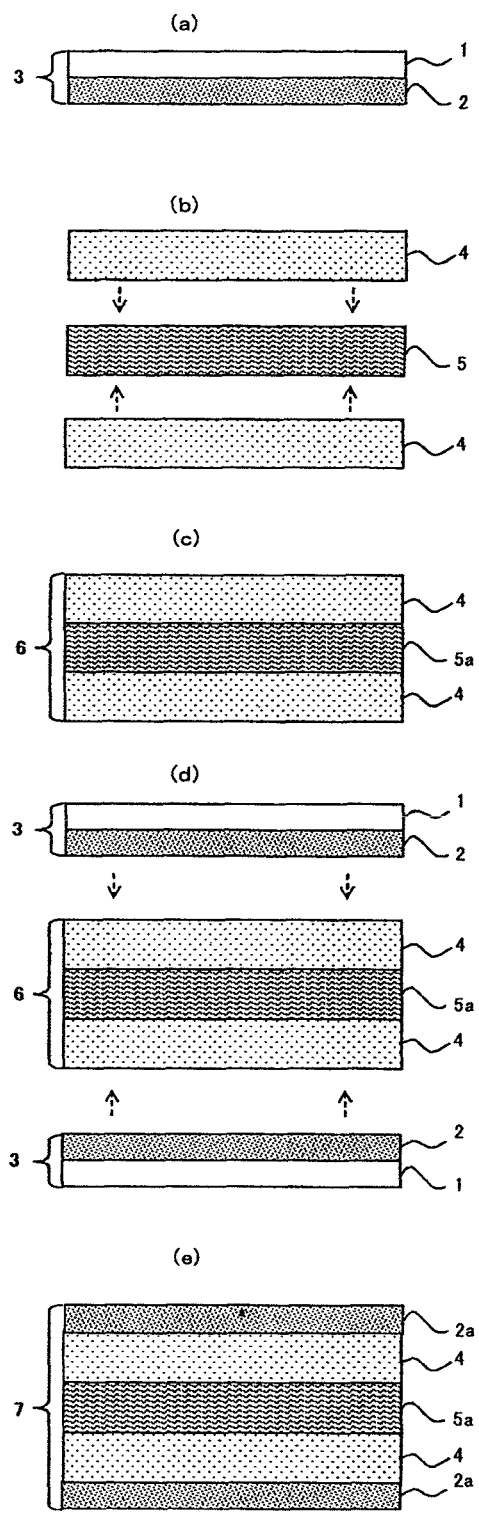

LAMINATE BODY, LAMINATE PLATE, MULTILAYER LAMINATE PLATE, PRINTED WIRING BOARD, AND METHOD FOR MANUFACTURE OF LAMINATE PLATE

This application claims priority under 35 USC 119(e) of prior U.S. provisional Application No. 61/537,859, filed Sep. 22, 2011, the contents of which are incorporated herein by reference in their entirety.

TECHNICAL FIELD

The present invention relates to a laminate body and a laminate plate suitable for use in semiconductor packages and printed wiring boards, to a printed wiring board and a multilayer laminate plate using the laminate plate, and to a method for producing the laminate plate.

BACKGROUND ART

Recently, the demand for thinner and lighter electronic instruments has become increasingly greater, and thinning and densification of semiconductor packages and printed wiring boards has been promoted. For stably packaging electronic parts with satisfying the demand for thinning and densification thereof, it is important to prevent the warping to occur in packaging.

In packaging, one reason for the warping to occur in semiconductor packages is the difference in the thermal expansion coefficient between the laminate plate used in a semiconductor package and the silicon chips to be mounted on the surface of the laminate plate. Accordingly, for the laminate plate for semiconductor packages, efforts are made to make the thermal expansion coefficient of the laminate plate nearer to the thermal expansion coefficient of the silicon chips to be mounted thereon, or that is, to lower the thermal expansion coefficient of the laminate plate. Another reason is that the elastic modulus of the laminate plate is low, for which, therefore, it may be effective to increase the elastic modulus of the laminate plate. To that effect, for reducing the warping of a laminate plate, it is effective to lower the expansion coefficient of the laminate plate and to increase the elastic modulus thereof.

Various methods may be taken into consideration for lowering the thermal expansion coefficient of a laminate plate and for increasing the elastic modulus thereof; and among them there is known a method of lowering the thermal expansion coefficient of the resin for laminate plates and increasing the fill ration with an inorganic filler to be in the resin. In particular, high-rate filling with an inorganic filler is a method by which reduction in the thermal expansion coefficient and also enhancement of heat resistance and flame retardance could be expected (Patent Reference 1). However, it is known that increasing the inorganic filler content results in insulation reliability degradation, adhesiveness failure between resin and the wiring layer to be formed on the surface thereof, and pressing failure in laminate plate production, and increasing the filler content is therefore limited.

Some approaches have been tried to attain the intended purpose of thermal expansion coefficient reduction through selection or modification of resin. For example, a method of increasing the crosslinking density of the resin for wiring boards to thereby increase Tg thereof and to reduce the thermal expansion coefficient thereof is generally employed in the art (Patent References 2 and 3). However, increasing the crosslinking density is to shorten the molecular chain between functional groups, but shortening the molecular chain to a level overstepping a certain threshold is limitative in view of the reactivity of the resin, and may often bring about a problem in that the resin strength would be lowered. Consequently, there is also a limit on lowering the thermal expansion coefficient according to the method of increasing the crosslinking density.

As in the above, for conventional laminate plates, lowering the thermal expansion coefficient thereof and increasing the elastic modulus thereof have heretofore been tried by increasing the fill ration with the inorganic filler therein and by employing a resin having a low thermal expansion coefficient; however, these are being pushed to the limit.

As a method differing from the above, there has been made a trial of using a glass film as a layer having a thermal expansion coefficient almost the same as the thermal expansion coefficient of electronic parts (silicon chips) and laminating a resin on the glass film by pressing to thereby reduce the thermal shock stress of the resulting laminate (Patent Reference 4); however, the elastic modulus of the resin layer is low and the thermal expansion coefficient thereof is high, and therefore the method is insufficient for realizing the reduction in the warp of substrate.

CITATION LIST

Patent References

[Patent Reference 1] JP-A 2004-182851
[Patent Reference 2] JP-A 2000-243864
[Patent Reference 3] JP-A 2000-114727
[Patent Reference 4] Japanese Patent No. 4657554

SUMMARY OF THE INVENTION

Problems that the Invention is to Solve

As described above, the substrate obtained according to the production method in Patent Reference 4 still has a low elastic modulus and a high thermal expansion coefficient, and is therefore insufficient for realizing the reduction in the warp of substrate.

The present invention has been made in consideration of the situation as above, and its object is to provide a laminate body which has a low thermal expansion coefficient and a high elastic modulus, which can be prevented from warping and which hardly crack and multilayer laminate plates, to provide a laminate plate and a multilayer laminate plate which hardly crack, to provide a printed wiring board using the laminate plate and the multilayer laminate plate, and to provide a production method for the laminate plate.

Means for Solving the Problems

Patent Reference 4 has no description at all relating to adding a fibrous base material to the resin for the substrate produced by laminating the resin on a glass film. From the description in Patent Reference 4, it is considered that incorporating a fibrous base material to the resin should be evaded. Specifically, in Patent Reference 4, one indispensable constituent feature is that the thermal expansion action of the entire substrate is substantially determined by the glass film (Claim 1 in Patent Reference 4). In view of this, the influence of the resin on the thermal expansion action of the substrate must be as small as possible, and for this, the modulus of elasticity of the resin must be kept as low as possible (in case where the resin has a high elastic modulus, the resin having such a high elastic modulus would have a great influence on the thermal expansion action of the entire substrate). On the other hand, when a fibrous base material is incorporated in the resin, then the resin may have an increased elastic modulus. Accordingly, from the description in Patent Reference 4, incorporating a fibrous base material to the resin must be evaded.

In addition, when a fibrous base material is incorporated in the resin in Patent Reference 4, it may be considered that the glass substrate may be broken with ease, as starting from the fibrous base material therein. From this viewpoint, it is presumed that incorporating a fibrous base material in the resin would be evaded in Patent Reference 4.

At present, there exists no case of incorporating a fibrous base material in a resin layer in a laminate plate of a glass substrate layer and a resin layer as in Patent Reference 4.

Surprisingly, however, as a result of assiduous studies made for solving the above-mentioned problems, the present inventors have found that, in a laminate plate containing a cured resin layer and a glass substrate layer, when a fibrous base material is incorporated in the cured resin layer, then there can be obtained a laminate plate which has a low thermal expansion coefficient and a high elastic modulus, which is prevented from warping and which hardly cracks.

The present invention has been made on the basis of the finding as above, and includes the following [1] to [12] as the gist thereof.

[1] A laminate body containing one or more resin composition layers and two or more glass substrate layers, wherein at least one layer of those one or more resin composition layers is a fiber-containing resin composition layer of a fiber-containing resin composition that contains a thermosetting resin and a fibrous base material, and at least one layer of those resin composition layers exists between any two layers of the glass substrate layers.

[2] The laminate body according to [1], wherein the thickness of the glass substrate layer is from 30 to 200 μm.

[3] The laminate body according to [1] or [2], wherein, of those two or more glass substrate layers, the glass substrate layer on the outermost surface side and the glass substrate layer on the outermost back side exist on the more surface side and on the more back side, respectively, than all the resin composition layers.

[4] The laminate body according to any of [1] to [3], wherein those one or more resin composition layers include a first resin composition layer facing the surface of the glass substrate layer on the outermost surface side, and a second resin composition layer facing the back of the glass substrate layer on the outermost back side, and the first resin composition layer and the second resin composition layer each are a non-fiber organic composition layer of a non-fiber organic composition that contains a thermosetting resin but does not contain a fibrous base material.

[5] The laminate body according to [4], wherein the first resin composition layer and the second resin composition layer each have a thickness of from 3 to 40 μm.

[6] The laminate body according to any of [1] to [5], wherein the fiber-containing resin composition layer contains an inorganic filler.

[7] The laminate body according to [6], wherein the inorganic filler is one or more selected from silica, alumina, talc, mica, aluminium hydroxide, magnesium hydroxide, calcium carbonate, aluminium borate and borosilicate glass.

[8] The laminate body according to any of [1] to [7], wherein the fibrous base material is one or more selected from glass fibers, polyimide fibers, polyester fibers and polytetrafluoroethylene fibers.

[9] The laminate body according to any of [1] to [8], wherein the thermosetting resin is one or more selected from an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin.

[10] A laminate plate containing one or more cured resin layers and two or more glass substrate layers, wherein at least one layer of those one or more cured resin layers is a fiber-containing cured resin layer of a cured product of a fiber-containing resin composition that contains a thermosetting resin and a fibrous base material, and at least one layer of those cured resin layers exists between any two layers of the glass substrate layers.

[11] The laminate plate according to [10], which has a storage elastic modulus at 40° C. of from 10 GPa to 70 GPa.

[12] The laminate plate according to [10] or [11], which is obtained by heating the laminate body of any one of [1] to [9].

[13] A multilayer laminate plate containing multiple laminate plates, wherein at least one laminate plate is the laminate plate of any of [10] to [12].

[14] A printed wiring board having the laminate plate of any one of [10] to [12] and a wiring provided on the surface of the laminate plate.

[15] A printed wiring board having the multilayer laminate plate of [13] and a wiring provided on the surface of the multilayer laminate plate.

[16] A method for producing a laminate plate of any one of [10] to [12], which comprises a cured resin layer forming step of forming a cured resin layer on the surface of a glass substrate.

[17] The method for producing a laminate plate according to [16], wherein the cured resin layer forming step is a step of laminating a film of the resin composition onto the glass substrate by the use of a vacuum laminator or a roll laminator, followed by curing the film.

[18] The method for producing a laminate plate according to [16], wherein the cured resin layer forming step is a step of arranging a film of the resin composition onto the glass substrate followed by pressing and curing the film.

Advantage of the Invention

According to the present invention, there are provided a laminate plate and a multilayer laminate plate which have a low thermal expansion coefficient and a high elastic modulus, which can be prevented from warping and which hardly crack, a laminate body favorable for production of the laminate plate and the multilayer laminate plate, a printed wiring board using the laminate plate and the multilayer laminate plate, and a method for producing the laminate plate.

BRIEF DESCRIPTION OF THE DRAWINGS

FIG. 1 This is a schematic cross-sectional view explaining the production method for the laminate plate of Example 4.

MODE FOR CARRYING OUT THE INVENTION

The laminate body, the laminate plate, the multilayer laminate plate, the printed wiring board, and the method for producing the laminate plate of the present invention are described in detail hereinunder.

In the present invention, the laminate body means one in which the constituent component of the thermosetting resin is uncured or semi-cured; and the laminate plate means one in which the constituent component of the thermosetting resin has been cured.

[Laminate Body]

The laminate body of the present invention contains one or more resin composition layers and two or more glass substrate layers, wherein at least one layer of those one or more resin composition layers is a fiber-containing resin composition layer of a fiber-containing resin composition that contains a thermosetting resin and a fibrous base material, and at least one layer of those resin composition layers exists between any two layers of the glass substrate layers.

Preferably, the size of the laminate body of the present invention is selected within a range where the width is from 10 mm to 1000 mm and the length is from 10 mm to 3000 mm (in case where the laminate body is used as a roll, its length may be suitably applied thereto) from the viewpoint of the handleability thereof. More preferably, the size is within a range where the width is from 25 mm to 550 mm and the length is from 25 mm to 550 mm.

The thickness of the laminate body of the present invention is selected preferably within a range of from 35 μm to 20 mm, depending on the use thereof. More preferably, the thickness of the laminate body is from 50 to 1000 μm, even more preferably from 80 to 600 μm, still more preferably from 100 to 500 μm, further more preferably from 110 to 400 μm.

The laminate plate that is obtained by curing the resin composition layer in the laminate body of the present invention to give a cured resin layer has a glass substrate layer that has a low thermal expansion coefficient and a high elastic modulus on the same level as that of silicon chips, and therefore the laminate plate may have a low thermal expansion coefficient and a high elastic modulus; and consequently, the laminate plate is prevented from warping and hardly cracks. In particular, the laminate plate has a glass substrate layer having high heat resistance, and therefore noticeably has low thermal expansivity in the temperature region of from 100° C. to lower than Tg of the cured resin. In addition, the fiber-containing cured organic layer contains a fibrous base material, and therefore the fiber-containing cured organic layer can have a low thermal expansion coefficient and a high elastic modulus as compared with a cured resin not containing a fibrous base material; and consequently, the laminate plate containing the fiber-containing cured resin layer can have a lower thermal expansion coefficient and a higher elastic modulus. Further, the laminate body of the present invention has two or more glass substrate layers, in which one or more resin composition layers exist between any two layers of those glass substrate layers; and consequently, when the laminate body is cured into a laminate plate in the manner as above, the resulting laminate may have a lower thermal expansion coefficient and a higher elastic modulus as compared with that formed of a laminate body having one glass substrate layer of which the thickness is on the same level as that of the total thickness of all the glass substrate layers in the laminate body of the present invention.

<Laminate Configuration of Laminate Body>

The laminate configuration of the laminate body is not specifically defined so far as it comprises one or more resin composition layers existing between any two layers of glass substrate layers, in which at least one layer of those one or more resin composition layers is a fiber-containing resin composition layer of a fiber-containing resin composition that contains a thermosetting resin and a fibrous base material.

<<First Laminate Configuration>>

For example, the configuration may be such that the glass substrate layer on the outermost surface side and the glass substrate layer on the outermost back side in the laminate body exist on the more surface side and on the more back side, respectively, than all the resin composition layers. Examples of the configuration of the type include the following:

"(Glass substrate layer/resin composition layer)$_m$/glass substrate layer" (where m is an integer of 1 or more).

In this, "glass substrate layer/resin composition layer" means lamination of a glass substrate layer and a resin composition layer. In other words, "/" means lamination of the two layers described on both the left and right sides of "/".

For example, the configuration where m is 1 or 2 includes the following:

"Glass substrate layer/resin composition layer/glass substrate layer".

"Glass substrate layer/resin composition layer/glass substrate layer/resin composition layer/glass substrate layer".

At least one of those resin composition layers must be a fiber-containing resin composition layer of a fiber-containing resin composition that contains a thermosetting resin and a fibrous base material. The laminate plate to be obtained from the laminate body that contains a resin base material can have a lower thermal expansion coefficient and a higher elastic modulus.

All the resin composition layers may be formed of the above-mentioned fiber-containing resin composition, but a part thereof may be formed of a non-fiber organic composition that contains a thermoplastic resin but does not contain a fibrous base material.

<<Second Laminate Configuration>>

Another configuration employable here comprises a first resin composition layer facing the surface of the glass substrate layer on the outermost surface side, and a second resin composition layer facing the back of the glass substrate layer on the outermost back side. Examples of the configuration of the type include the following:

"First resin composition layer/(glass substrate layer/resin composition layer)$_n$/glass substrate layer/second resin composition layer" (where n is an integer of 1 or more).

For example, the configuration where n is 1 or 2 includes the following:

"First resin composition layer/glass substrate layer/resin composition layer/glass substrate layer/second resin composition layer".

"First resin composition layer/glass substrate layer/resin composition layer/glass substrate layer/resin composition layer/glass substrate layer/second resin composition layer".

At least one of those resin composition layers must be a fiber-containing resin composition layer of a fiber-containing resin composition that contains a thermosetting resin and a fibrous base material. The laminate plate to be obtained from the laminate body that contains a resin base material can have a lower thermal expansion coefficient and a higher elastic modulus.

In addition, the configuration has the first resin composition layer and the second resin composition layer, in which, therefore, the glass substrate layer is prevented from being exposed out so that the laminate body may be in direct contact with any external substance, and the glass substrate layer is prevented from cracking and its handleability (easiness in handling) can be thereby enhanced. Preferably, the first resin composition layer and the second resin composition layer each are a non-fiber organic composition layer of a non-fiber organic composition that contains a thermosetting resin but does not contain a fibrous base material. Accordingly, the glass substrate layer can be prevented from cracking, and the handleability (easiness in handling) thereof can be enhanced. The first resin composition layer and the second resin composition layer which contain no fibrous base material can be thinned and the laminate plate can be thereby made to have a higher elastic modulus.

<Fiber-Containing Resin Composition>

The fiber-containing resin composition in the present invention contains a thermosetting resin and a fibrous base material.

<<Thermosetting Resin>>

Not specifically defined, the thermosetting resin includes, for example, an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin. Of those, preferred are an epoxy resin and a cyanate resin as excellent in moldability and electric insulation quality.

The epoxy resin includes, for example, bisphenol A-type epoxy resin, bisphenol F-type epoxy resin, bisphenol S-type epoxy resin, phenol-novolak-type epoxy resin, cresol-novolak-type epoxy resin, bisphenol A-novolak-type epoxy resin, bisphenol F-novolak-type epoxy resin, stilbene-type epoxy resin, triazine skeleton-containing epoxy resin, fluorene skeleton-containing epoxy resin, triphenolphenol-methane-type epoxy resin, biphenyl-type epoxy resin, xylylene-type epoxy resin, biphenylaralkyl-type epoxy resin, naphthalene-type epoxy resin, dicyclopentadiene-type epoxy resin, alicyclic epoxy resin, diglycidyl ether compound of polyfunctional phenol and polycyclic aromatic compound such as anthracene, etc. Further mentioned are phosphorus-containing epoxy resins produced by introducing a phosphorus compound into these epoxy resins. Of those, preferred are biphenylaralkyl-type epoxy resin and naphthalene-type epoxy resin from the viewpoint of the heat resistance and the flame retardance thereof. One alone or two or more of these may be used here as combined.

The cyanate resin includes, for example, bisphenol-type cyanate resins such as novolak-type cyanate resin, bisphenol A-type cyanate resin, bisphenol E-type cyanate resin, tetramethylbisphenol F-type cyanate resin, etc., and their partially-triazinated prepolymers. Of those, preferred is novolak-type cyanate resin from the viewpoint of the heat resistance and the flame retardance thereof. One alone or two or more of these may be used here as combined.

The content of the thermosetting resin to be contained in the fiber-containing resin composition is preferably within a range of from 20 to 80% by mass relative to the mass of the non-fibrous base material component obtained by subtracting the content of the fibrous base material from the total amount of the fiber-containing resin composition, more preferably from 25 to 60% by mass, even more preferably from 25 to 50% by mass, still more preferably from 25 to 40% by mass.

<<Fibrous Base Material>>

Not specifically defined, the fibrous base material includes inorganic fibers of E-glass, D-glass, S-glass, Q-glass and the like; organic fibers of polyimide, polyester, polytetrafluoroethylene and the like; and their mixtures. The fibrous base material may have a form of, for example, woven fabric, nonwoven fabric, roving, chopped strand mat, surfacing mat, etc. The material and the form may be suitably selected depending on the intended use and performance of the molded product, and if desired, one alone or two or more different types of materials and forms may be used here either singly or as combined.

The thickness of the base material is not specifically defined. For example, those having a thickness of from 0.03 to 0.5 mm can be used; and those processed for surface treatment with a silane coupling agent or the like and those processed for mechanical opening treatment are preferred here from the viewpoint of the heat resistance, the moisture resistance and the workability thereof.

Preferably, the total content of the fibrous base material is within a range of from 10 to 80% by volume relative to the sum total of the fiber-containing resin composition, more preferably from 15 to 75% by volume, even more preferably from 20 to 70% by mass, still more preferably from 30 to 60% by mass, further more preferably from 30 to 55% by mass.

<<Inorganic Filler>>

The fiber-containing resin composition may further contain an inorganic filler.

In case where the fiber-containing resin composition contains an inorganic filler, the content of the inorganic filler therein is preferably within a range of from 5 to 75% by volume relative to the non-fibrous base material component of the fiber-containing resin composition from which the fibrous base material has been removed. More preferably, the content of the inorganic filler is from 15 to 70% by mass, even more preferably from 30 to 70% by mass, relative to the non-fibrous base material component of the fiber-containing resin composition from which the fibrous base material has been removed.

The inorganic filler includes, for example, silica, alumina, talc, mica, aluminium hydroxide, magnesium hydroxide, calcium carbonate, aluminium borate and borosilicate glass.

Of those, preferred is silica from the viewpoint of the low thermal expansivity thereof, and more preferred is spherical amorphous silica of which the thermal expansion coefficient is 0.6 ppm/K or so and is extremely small and of which the flowability reduces little when highly filled in resin.

The spherical amorphous silica is preferably one having a cumulative 50% particle diameter of from 0.01 to 10 μm, more preferably from 0.03 to 5 μm.

The cumulative 50% particle diameter as referred to herein means the particle diameter of a powder at the point corresponding to just the 50% volume based on the total volume 100% of the powder, as read on the particle-size cumulative frequency distribution curve thereof; and this may be determined according to a laser diffractive scattering method using a particle size distribution analyzer, etc.

Using silica having a mean primary particle diameter of at most 1 μm (nanosilica) as the inorganic filler makes it possible to form a microwiring on the fiber-containing cured resin layer of the laminate plate. Nanosilica is preferably one having a specific surface area of at least 20 $m^2$/g. From the viewpoint of reducing the surface profile after roughening treatment in the plating process for the laminate plate, the mean primary particle diameter is preferably at most 100 nm. The specific surface area can be measured according to a BET method.

The "mean primary particle diameter" as referred to herein means a mean particle diameter of the non-aggregated simple particle, and does not mean the mean diameter of aggregated particles, or that is, the secondary particle diameter thereof. The mean primary particle diameter can be determined, for example, by analyzing the powder with a laser diffractive particle sizer. As the inorganic filler of the type, preferred is fumed silica.

Further, the inorganic filler is preferably treated with a surface treatment agent such as a silane coupling agent or the like for enhancing the moisture resistance thereof, and is also preferably hydrophobized for enhancing the dispersibility thereof.

In case where a microwiring is formed on the fiber-containing cured resin layer of the laminate plate, the content of the inorganic filler is preferably at most 20% by mass of non-fibrous component in the fiber-containing resin composition from which the fibrous base material has been removed. When the content is at most 20% by mass, then the layer can keep the good surface profile after roughening treatment and the plating characteristics thereof and also the interlaminar insulation reliability thereof can be prevented from worsening. On the other hand, it is expected that, by incorporating the inorganic filler thereinto, the thermal expansivity of the fiber-containing resin composition could be reduced and the elastic modulus thereof could be increased, and therefore, in case where the thermal expansivity reduction and the elastic modulus increase along with to the microwiring formation are considered important, the content of the inorganic filler is preferably from 3 to 20% by mass.

<<Other Components>>

In addition to the above-mentioned components, a curing agent, a curing promoter, a thermoplastic resin, an elastomer, a flame retardant, a UV absorbent, an antioxidant, a photopolymerization initiator, a fluorescent brightener, an adhesiveness improver and the like may be added to the fiber-containing resin composition.

For example, in case where an epoxy resin is used, examples of the curing agent include polyfunctional phenol compounds such as phenol-novolak, cresol-novolak, etc.; amine compounds such as dicyandiamide, diaminodiphenylmethane, diaminodiphenyl sulfone, etc.; acid anhydrides such as phthalic anhydride, pyromellitic anhydride, maleic anhydride, maleic anhydride copolymer, etc.; and polyimides. Different types of these curing agents may be used as combined.

Examples of the curing promoter, for example, for epoxy resin include, imidazoles and their derivatives; organic phosphorus compounds; secondary amines, tertiary amines, and quaternary ammonium salts.

Examples of the UV absorbent include benzotriazole-type UV absorbents.

The antioxidant includes hindered phenol-type or styrenated phenol-type antioxidants.

Examples of the photopolymerization initiator include benzophenones, benzyl ketals, thioxanthone-type photopolymerization initiators, etc.

Examples of the fluorescent brightener include fluorescent brighteners such as stilbene derivatives.

Examples of the adhesiveness improver include urea compounds such as ureasilane, silane coupling agents, and the like.

<Fiber-Containing Resin Composition Layer>

The fiber-containing resin composition layer comprises the above-mentioned fiber-containing resin composition. The fiber-containing resin composition layer includes not only an uncured fiber-containing resin composition but also a semi-cured fiber-containing resin composition.

Preferably, the size of the fiber-containing resin composition layer in the present invention is selected within a range where the width is from 10 mm to 1000 mm and the length is from 10 mm to 3000 mm (in case where the laminate body is used as a roll, its length may be suitably applied thereto). More preferably, the size is within a range where the width is from 25 mm to 550 mm and the length is from 25 mm to 550 mm from the viewpoint of the handleability of the layer.

Preferably, the thickness of the fiber-containing resin composition layer in the present invention is selected within a range of from 3 µm to 200 µm/layer. From the viewpoint of lowering the thermal expansion coefficient of the laminate body and the laminate plate and increasing the elastic modulus thereof, the thickness of the resin composition is preferably from 3 to 150 µm/layer, more preferably from 10 to 120 µm, even more preferably from 20 to 120 µm, still more preferably from 25 to 110 µm.

Preferably, in the present invention, the fiber-containing resin composition layer is contained in the laminate body in a proportion of from 4 to 90% by volume relative to the entire laminate body, more preferably from 10 to 80% by volume, even more preferably from 20 to 70% by volume, still more preferably from 25 to 60% by volume.

The laminate body and the laminate plate of the present invention have at least one resin composition layer containing a fibrous base material, but may further have any other resin composition layer not containing a fibrous base material. The resin composition layer not containing a fibrous base material may be arranged, for example, between the glass layer and the fibrous base material-containing resin composition layer for the purpose of enhancing the adhesiveness between the two layers.

The resin content in the fiber-containing resin composition layer, after dried, is preferably from 20 to 90% by mass, more preferably from 25 to 85% by mass, even more preferably from 30 to 80% by mass, still more preferably from 40 to 70% by mass, further more preferably from 45 to 70% by mass. When the content is at least 20% by mass, then the workability and the handleability (easiness in handling) of the layer may be enhanced. When the content is at most 90% by mass, then the content of the fibrous base material in the layer may be large and therefore the laminate plate to be produced by curing the fiber-containing resin composition layer in the laminate body can have a low thermal expansion coefficient and a high elastic modulus. The resin content means the amount of the other component than the fibrous base material in the total amount of the fiber-containing resin composition.

In case where an inorganic filler is incorporated in the fiber-containing resin composition, preferably, the amount thereof is from 5 to 75% by volume of the total amount of the thermosetting resin and the inorganic filler, more preferably from 15 to 70% by volume, even more preferably from 30 to 70% by volume. When the content of the inorganic filler is from 5 to 75% by volume of the total amount of the thermosetting resin and the inorganic filler, then the thermal expansion coefficient of the resin composition can be sufficiently reduced and the composition can have suitable flowability and is excellent in moldability. Specifically, when the content of the inorganic filler is 5% by volume or more, then the effect of reducing the thermal expansion coefficient can be sufficient; and when 75% by volume or less, then the flowability increases and the moldability is thereby bettered.

<Non-Fiber Resin Composition Layer>

The non-fiber resin composition layer comprises a non-fiber resin composition which contains a thermosetting resin but does not contain a fibrous base material. The non-fiber resin composition contains a thermoplastic resin, and may further contain an inorganic filler and any other component. The details of the thermoplastic resin, the inorganic filler and other components are described in the previous section relating to the fiber-containing resin composition.

In case where the non-fiber resin composition layer is used as the first and second resin composition layers mentioned above, its thickness is preferably at least 3 µm from the viewpoint of preventing the glass substrate layer from cracking and enhancing the handleability (easiness in handling) of the glass substrate layer. On the other hand, from the viewpoint of securing the low thermal expansion coefficient and the high elastic modulus of the laminate plate to be produced by curing the resin composition layer, the thickness is preferably at most 40 μm. From these viewpoints, the thickness of the first and second resin composition layers is preferably from 3 to 40 μm, more preferably from 10 to 30 μm, even more preferably from 15 to 25 μm each. Preferably, the first and second resin composition layers do not contain an inorganic filler.

In case where a non-fiber resin composition layer is used in the present invention, preferably, the non-fiber resin composition layer is contained in a ratio of from 1 to 40% by volume of the entire laminate body, more preferably from 1 to 30% by volume, even more preferably from 1 to 25% by volume.

<Glass Substrate Layer>

For the purpose of thinning the laminate body and from the viewpoint of the workability thereof, preferably, the glass substrate to constitute the glass substrate layer is a thin glass film having a thickness of from 30 to 200 μm/layer; and in consideration of the easiness in handling the film and of the practicability thereof, the thickness is more preferably from 50 to 150 μm, even more preferably from 80 to 120 μm. The thickness of the glass substrate layer as referred to herein indicates the mean thickness of the glass substrate layer. The mean thickness of the glass substrate layer may be determined by the use of any known thickness measuring device such as a micrometer, a thickness gauge or the like. For example, for a rectangular or square glass substrate layer, the thickness thereof is measured at four corners and at the center thereof with a micrometer, and the mean value of the found data is referred to as the mean thickness of the glass substrate layer. The material of the glass substrate layer may be glass such as alkali silicate glass, alkali-free glass, quartz glass or the like, but from the viewpoint of the low thermal expansivity thereof, preferred is borosilicate glass.

Preferably, the size of the glass substrate layer in the present invention is selected within a range where the width is from 10 mm to 1000 mm and the length is from 10 mm to 3000 mm (in case where the laminate body is used as a roll, its length may be suitably applied thereto). More preferably, the width is within a range of from 25 mm to 550 mm and the length is from 25 mm to 550 mm from the viewpoint of the handleability of the layer.

The thermal expansion coefficient of the glass substrate layer is preferably nearer to the thermal expansion coefficient (3 ppm/° C. or so) of silicon chips since the laminate body or the laminate plate to be obtained from the laminate body can be well prevented from warping, and is more preferably at most 8 ppm/° C., even more preferably at most 6 ppm/° C., still more preferably at most 4 ppm/° C.

The storage elastic modulus at 40° C. of the glass substrate layer is preferably larger, and is more preferably at least 20 GPa, even more preferably at least 25 GPa, still more preferably at least 30 GPa.

Preferably, the glass substrate layer accounts for from 10 to 70% by volume of the entire laminate body, more preferably from 15 to 70% by volume, even more preferably from 20 to 70% by volume, still more preferably from 30 to 70% by volume, further more preferably from 40 to 70% by volume. When the content of the glass substrate is at least 10% by volume, then it is advantageous for attaining low thermal expansivity and high elasticity; but on the contrary, when the content of the glass substrate layer is at most 70% by volume, then it is advantageous in point of the workability and the handleability (easiness in handling) of the laminate body.

From the same viewpoints, the amount of the resin composition layers, or that is, the total amount of the fiber-containing resin composition layer and the non-fiber resin composition layer is preferably from 30 to 90% by volume of the entire laminate body, more preferably from 30 to 85% by volume, further preferably from 30 to 80, further more preferably from 30 to 70% by volume, still more preferably from 30 to 60% by volume.

<Support Film>

The above-mentioned laminate body may have a support film on the surface thereof. The support film is described in detail in the next section of the description of the production method for the laminate body.

[Production Method for Laminate Body]

The production method for the laminate body includes a cured resin layer forming step of forming the above-mentioned cured resin layer on the surface of the above-mentioned glass substrate. Not specifically defined but preferably, the cured resin layer forming step comprises, for example, laminating a film of a resin composition onto a glass substrate through pressure lamination using a vacuum laminator, a roll laminator or the like, followed by curing it thereon. For vacuum lamination or roll lamination, usable is commercially-available vacuum laminator or roll laminator.

The thermosetting resin in the resin composition layer is preferably one capable of melting at a temperature not higher than the temperature in lamination. For example, in case where a vacuum laminator or a roll laminator is used for lamination, in general, the lamination is attained at 140° C. or lower, and therefore, the thermosetting resin is preferably one capable of melting at 140° C. or lower.

Next described are a production example for a fiber-containing resin composition layer (prepreg), a production example for a non-fiber resin composition layer, and a production example for a laminate body through pressure lamination.

<Production Example for Fiber-Containing Resin Composition Layer (Prepreg)>

The prepreg can be favorably obtained by applying a resin composition that contains the above-mentioned thermosetting resin and optionally the above-mentioned inorganic filler to a fibrous base material by dipping or coating, followed by heating and drying it to thereby convert it into a B-stage one (semi-curing). The B-stage conversion may be attained by heating and drying the layer generally at a temperature of from 100 to 200° C. for from 1 to 30 minutes or so.

As the coating apparatus for the resin composition layer, herein employable is any coating apparatus known to those skilled in the art, such as a comma coater, a bar coater, a kiss coater, a roll coater, a gravure coater, a die coater, etc. It is desirable that the coating apparatus is suitably selected depending on the thickness of the film to be formed.

The prepreg may be formed on a support film, and on the surface of the side opposite to the support film-forming surface of the prepreg, a protective film may be provided for protecting that surface.

As the support film, for example, there may be mentioned polyolefins such as polyethylene, polyvinyl chloride, etc.; polyesters such as polyethylene terephthalate (hereinafter this may be abbreviated as "PET"), polyethylene naphthalate, etc.; polycarbonates, polyimides; and further release paper, as well as metal foils such as copper foil, aluminium foil, etc. In case where a copper foil is used as the support film, the copper film may be used as a conductor layer directly as it is for circuit formation thereon. In this case, as the copper foil, there are mentioned rolled copper, electrolytic copper foil, etc., and in general, those having a thickness of from 2 μm to 36 μm are used. In case where a thin copper foil is used, a carrier-supported copper foil may be used for enhancing the workability thereof.

The support film may be mat-treated, corona-treated and also release-treated.

The thickness of the support film is generally from 10 µm to 150 µm, preferably from 25 to 50 µM. When thinner than 10 µm, the film would be difficult to handle. On the other hand, the support film is, in general, finally peeled off or removed, as described above, and therefore, when the thickness thereof is more than 150 µm, it is unfavorable from the viewpoint of energy saving.

For the protective film, the same material as or a different material from that for the support film may be used. Not specifically defined, the thickness of the protective film may be the same as that of the support film, but is more preferably within a range of from 1 to 40 µm.

<Production Example for Non-Fiber Resin Composition Layer>

One example of the production method for the non-fiber resin composition layer comprises dissolving a non-fiber resin composition in an organic solvent to prepare a varnish. Next, the varnish is applied onto the above-mentioned support film serving as a support, and the organic solvent is evaporated away by heating or hot air blowing, thereby forming the non-fiber resin composition layer. Before or during or after drying, the above-mentioned protective film may be provided on the surface of the non-fiber resin composition layer on which the support film is not formed.

As the coating apparatus for the resin composition layer, herein employable is any coating apparatus known to those skilled in the art, such as a comma coater, a bar coater, a kiss coater, a roll coater, a gravure coater, a die coater, etc. It is desirable that the coating apparatus is suitably selected depending on the thickness of the film to be formed.

<Production Example for Laminate Body Through Pressure Lamination>

For pressure lamination using a vacuum laminator or a roll laminator, one prepreg or a prepreg stack to be prepared by stacking a plurality of (for example from 2 to 20) prepregs may be laminated with a glass substrate and optionally with the above-mentioned, non-fiber resin composition layer. For vacuum lamination or roll lamination, usable is commercially-available vacuum laminator or roll laminator.

In case where one having a support film or a protective film attached thereto is used as the prepreg and the non-fiber resin composition layer, the support film and the protective film are removed before pressure lamination. However, the support film of the prepreg and the non-fiber resin composition layer that constitutes the outermost surface of the laminate body may be good not to be removed before pressure lamination.

Regarding the lamination condition, preferably, the prepreg, the glass substrate and optionally the non-fiber resin composition layer are optionally pre-heated and then laminated at a bonding temperature (lamination temperature) of preferably from 60° C. to 140° C. and under a bonding pressure of preferably from 1 to 11 kgf/cm², In case where a vacuum laminator is used, preferably, the lamination is attained under a reduced pressure of a pneumatic pressure of at most 20 mmHg (26.7 hPa). The lamination method may be in a batch mode or in a continuous mode with rolls.

After laminated in the manner as above, this is cooled to around room temperature to give the intended laminate body.

The thermosetting resin to be in the resin composition is preferably one capable of melting at a temperature not higher than the lamination temperature. For example, in case where a vacuum laminator or a roll laminator is used, in general, the lamination is attained at 140° C. or lower, and therefore, the thermosetting resin to be in the resin composition is preferably one capable of melting at 140° C. or lower.

[Laminate Plate]

The laminate plate of the present invention contains one or more cured resin layers and one or more glass substrate layers, wherein at least one layer of those one or more cured resin layers is a fiber-containing cured resin layer of a cured product of a fiber-containing resin composition that contains a thermosetting resin and a fibrous base material, and at least one layer of those cured resin layers exists between any two layers of the glass substrate layers.

Preferably, the size of the laminate plate of the present invention is selected within a range where the width is from 10 mm to 1000 mm and the length is from 10 mm to 3000 mm (in case where the laminate plate is used as a roll, its length may be suitably applied thereto). More preferably, the size is within a range where the width is from 25 mm to 550 mm and the length is from 25 mm to 550 mm.

The thickness of the laminate plate of the present invention is selected preferably within a range of from 36 µm to 20 mm, depending on the use thereof. More preferably, the thickness of the laminate plate is from 50 to 1000 µm, even more preferably from 80 to 600 µm, still more preferably from 100 to 500 µm, further more preferably from 110 to 400 µm.

Preferably, the laminate plate is so designed that the resin composition layer of the above-mentioned laminate body forms the cured resin layer thereof. In this case, the details of the glass substrate layer and the resin composition are described in the section of the laminate body given hereinabove. Preferably, the thickness of the cured resin layer is on the same level as that of the thickness of the above-mentioned resin composition layer; and preferably, the proportion of the cured resin layer and the glass substrate layer in the laminate plate is on the same level as that of the proportion of the resin composition layer and the glass substrate layer in the above-mentioned laminate body.

<Fiber-Containing Cured Resin Layer>

Preferably, the thickness of the fiber-containing cured resin layer is from 3 to 200 µm. When the thickness is at least 3 µm, then the laminate plate is prevented from cracking. When the thickness is at most 200 µm, then the thickness of the glass substrate layer could be relatively large and the laminate plate can therefore have a lowered thermal expansion coefficient and an increased elastic modulus. From these viewpoints, the thickness of the fiber-containing cured resin layer is more preferably from 3 to 150 µm, further preferably from 10 to 120 µm, further more preferably from 20 to 120 µm, still more preferably from 40 to 110 µm. However, the suitable range of the thickness of the fiber-containing cured resin layer may vary depending on the thickness of the glass substrate layer and the number of the layers, and the type of the fiber-containing cured resin layer and the number of the layers, and therefore the thickness of the fiber-containing cured resin layer is not limited to the above-mentioned range.

The storage elastic modulus at 40° C. of the fiber-containing cured resin layer is preferably from 10 to 80 GPa. When the modulus is at least 10 GPa, then the glass substrate layer can be protected and the laminate plate can be prevented from cracking. When the modulus is at most 80 GPa, then the stress resulting from the difference in the thermal expansion coefficient between the glass substrate layer and the fiber-containing cured resin layer is retarded, and the laminate plate can be thereby prevented from warping and cracking. From these viewpoints, the storage elastic modulus of the fiber-containing cured resin layer is more preferably from 12 to 75 GPa, even more preferably from 15 to 70 GPa.

A metal foil of copper, aluminium, nickel or the like may be provided on one or both surfaces of the laminate plate. The metal foil may be any one for use for electric insulation materials, and is not specifically defined.

<Characteristics of Laminate Plate>

The storage elastic modulus at 40° C. of the laminate plate is preferably from 10 to 70 GPa from the viewpoint of preventing the laminate plate from warping and cracking, more preferably from 20 to 60 GPa, even more preferably from 25 to 50 GPa, still more preferably from 25 to 45 GPa.

The mean thermal expansion coefficient within a range of from 50 to 120° C. of the laminate plate is preferably from 1 to 10 ppm/° C. from the viewpoint of preventing the laminate plate from warping and cracking, more preferably from 2 to 8 ppm/° C., even more preferably from 2 to 6 ppm/° C., still more preferably from 2 to 5.5 ppm/° C.

The mean thermal expansion coefficient within a range of from 120 to 190° C. of the laminate plate is preferably from 1 to 15 ppm/° C. from the viewpoint of preventing the laminate plate from warping and cracking, more preferably from 2 to 10 ppm/° C., even more preferably from 2 to 8 ppm/° C., still more preferably from 2 to 6 ppm/° C.

[Production Method for Laminate Plate]

The production method for the above-mentioned laminate plate is not specifically defined. Next, concrete examples of the production method for the laminate plate are described.

<Production Example by Thermal Curing of Laminate Body Obtained Through Lamination>

In the laminate body obtained through the above-mentioned lamination, the resin composition layer is thermally cured to give a laminate plate.

The thermal curing condition is selected within a range of from 150° C. to 220° C. and from 20 minutes to 80 minutes, more preferably from 160° C. to 200° C. and from 30 minutes to 120 minutes. In case where a release-treated support film is used, the support film may be peeled off after thermal curing.

The method does not require pressurization in producing the laminate plate, in which, therefore, the laminate plate can be prevented from cracking during production.

<Production Example According to Pressing Method>

The laminate plate of the present invention may also be produced according to a pressing method.

For example, the laminate body obtained through the above-mentioned lamination may be heated under pressure and cured according to a pressing method to give the laminate plate.

In addition, one prepreg or a prepreg stack to be prepared by stacking a plurality of (for example from 2 to 20) prepregs may be laminated with a glass substrate and optionally with a non-fiber composition layer, and may be heated, pressurized and cured according to a pressing method to give a laminate plate. In this case, a support film may be added to the surface of the outermost prepreg, and the prepreg or the prepreg stack may be heated, pressurized and cured according to a pressing method to give a laminate plate.

The pressing method is favorable from the viewpoint of uniform molding, in which, however, the lamination condition may be often limited since the glass substrate may crack during lamination. On the other hand, the production method (lamination method) of thermally curing the laminate body obtained through lamination is favorable from the viewpoint that the glass substrate hardly cracks and that the production method is easy to carry out; however, depending on the properties and the content of the fiber-containing resin composition and the fibrous base material, the molding may be often difficult. Consequently, it is desirable that the pressing method and the lamination method are suitably used as the situation demands.

[Multilayer Laminate Plate and its Production Method]

The multilayer laminate plate of the present invention contains multiple laminate plates, wherein at least one laminate plate is the above-mentioned laminate plate of the present invention.

The production method for the multilayer laminate plate is not specifically defined.

For example, a plurality (for example, from 2 to 20) of the above-mentioned laminate bodies are stacked in layers and molded through lamination to give the multilayer laminate plate. Concretely, using a multistage press, a multistage vacuum press, a continuous molding machine, an autoclave molding machine or the like, the laminated bodies are molded at a temperature of from 100 to 250° C. or so, under a pressure of from 2 to 100 MPa or so, and for a heating time of from 0.1 to 5 hours or so.

[Printed Wiring Board and its Production Method]

The printed wiring board of the present invention has the above-mentioned laminate plate or multilayer laminate plate, and a wiring formed on the surface of the laminate plate or the multilayer laminate plate.

Next described is the production method for the printed wiring board.

<Formation of Via-Holes>

The above-mentioned laminate plate is worked optionally according to a method of drilling, laser processing, plasma processing or a combination thereof, thereby forming via-holes or through-holes therein. As the laser, generally used is a carbon dioxide laser, a YAG laser, a UV laser, an excimer laser or the like.

<Formation of Conductor Layer>

Next, a conductor layer is formed on the laminate plate through dry plating or wet plating thereon.

For dry plating, employable is any known method of vapor deposition, sputtering, ion plating or the like.

In case of wet plating, first, the surface of the laminate plate is roughened with an oxidizing agent such as a permanganate (potassium permanganate, sodium permanganate, etc.), a bichromate, ozone, hydrogen peroxide/sulfuric acid (that is, a mixture of hydrogen peroxide and sulfuric acid), nitric acid or the like to thereby form irregular anchors thereon. As the oxidizing agent, especially preferred is an aqueous sodium hydroxide solution of potassium permanganate, sodium permanganate or the like (aqueous alkaline permanganate solution). Next, a conductor layer is formed according to a method of combination of electroless plating and electrolytic plating. A plating resist having an opposite pattern to the intended conductor layer may be formed, and the conductor layer may be formed by electroless plating alone.

In case where a support film having a metal foil on the surface thereof is used in the laminate body, the conductor layer formation step may be omitted.

<Formation of Wiring Pattern>

As the subsequent patterning method, for example, employable here is any known subtractive method, semi-additive method or the like.

[Multilayer Printed Wiring Board and its Production Method]

As one embodiment of the above-mentioned printed wiring board, provided here is a multilayer printed wiring board by laminating multiple laminate plates each having a wiring pattern formed thereon as in the above.

For producing the multilayer printed wiring board of the type, a plurality of the above-mentioned laminated plates each with a wiring pattern formed thereon are laminated via the above-mentioned adhesive film arranged therebetween for multilayer formation. Subsequently, through-holes or blind via-holes are formed in the board by drilling or laser processing, and then an interlaminar wiring is formed through plating or by the use of a conductive paste. According to the process, a multilayer printed wiring board is produced.

[Metal Foil-Attached Laminate Plate and Multilayer Laminate Plate, and their Production Method]

The above-mentioned laminate plate and multilayer laminate plate may be metal foil-attached laminate plate and multilayer laminate plate each having a metal plate of copper, aluminium, nickel or the like on one or both surfaces thereof.

The production method for the metal foil-attached laminate plate is not specifically defined. For example, as mentioned above, a metal foil may be used as the support film to produce a metal-foil attached laminate plate.

One or a plurality (for example, from 2 to 20) of the above-mentioned laminate plates produced through lamination may be piled up, and a metal foil is arranged on one or both surfaces thereof, and these may be molded through lamination to give a metal foil-attached laminate plate.

Regarding the molding condition, any method of producing laminate plate or multilayer plate for electric insulating materials is usable here; and for example, using a multistage press, a multistage vacuum press, a continuous molding machine, an autoclave molding machine or the like, the laminate configuration may be molded at a temperature of from 100 to 250° C. or so, under a pressure of from 2 to 100 MPa or so, and for a heating time of from 0.1 to 5 hours or so.

<Evaluation Method for Thermal Expansion Coefficient>

The thermal expansion coefficient of the laminate plate may be measured, using a thermal mechanical analysis (TMA), a temperature-dependent 3D displacement analyzer (DIC, digital image correlation), a laser interferometer, etc.

<Evaluation Method for Elastic Modulus>

The elastic modulus of the laminate plate may be determined by measuring, for example, the storage elastic modulus thereof using a wide-area viscoelasticity measuring device, and also by measuring the bending modulus thereof as a static elastic modulus. The bending elastic modulus may be measured according to a three-point bending test.

EXAMPLES

Next, the present invention is described in more detail with reference to Examples and Comparative Examples; however, the present invention is not limited to these descriptions.

In Examples and Comparative Examples, "part" and "%" mean "part by mass" and "% by mass", respectively.

<Production of Solution of Unsaturated Maleimide Group-Having Resin Composition>

In a heatable and coolable reactor having a capacity of 2 liters and equipped with a thermometer, a stirrer and a moisture meter provided with a reflux condenser tube, 69.10 g of 4,4'-bis(4-aminophenoxy)biphenyl, 429.90 g of bis(4-maleimidophenyl)sulfone, 41.00 g of p-aminophenol and 360.00 g of propylene glycol monomethyl ether were put, and reacted at the reflux temperature for 2 hours, thereby giving a solution of a resin composition having an acidic substituent and an unsaturated maleimide group.

<Production of Thermosetting Resin Composition-Containing Varnish>

The following were used here.
(1) The above-mentioned, unsaturated maleimide group-having resin composition solution, as a curing agent (A);
(2) A bifunctional naphthalene-type epoxy resin [DIC's product name, HP-4032D] as a thermosetting resin (B);
(3) An isocyanate-masked imidazole [Daiichi Kogyo Seiyaku's product name, G8009L] as a modified imidazole (C),
(4) A molten silica [Admatec's product name, SC2050-KC; concentration 70%; mean particle size of primary particles, 500 nm; specific surface area according to BET method, 6.8 m$^2$/g] as an inorganic filler (D),
(5) A phosphorus-containing phenolic resin [Sanko Chemical's product name, HCA-HQ, phosphorus content 9.6% by mass] as a flame retardance-imparting, phosphorus-containing compound (E),
(6) A crosslinked acrylonitrile-butadiene rubber (NBR) particles [JSR's product name, XER-91] as a compound (F) that enables chemical roughening, and
(7) Methyl ethyl ketone as a diluting solvent.

These were mixed in the blend ratio (part by mass) as shown in Table 1 to prepare a uniform varnish (G) having a resin content (total of resin components) of 65% by mass and a solvent content of 35% by mass.

TABLE 1

|  | part by mass |
| --- | --- |
| Curing Agent (A) | 50 |
| Thermosetting Resin (B) | 49.5 |
| Modified Imidazole (C) | 0.5 |
| Inorganic Filler (D) | 40 |
| Phosphorus-Containing Compound (E) | 3 |
| Compound (F) | 1 |

[Production of Prepreg]

The above-mentioned varnish (G) was applied onto E-glass cloths each having a different thickness by dipping, and then dried under heat at 160° C. for 10 minutes to give a 250 mm×250 mm prepreg. Regarding the type of the E-glass cloth, used here were three types of Asahi Kasei E-Materials' IPC standard 1027, 1078 and 2116. The resin content in the prepreg prepared here by the use of these three types of glass cloths (these may be referred to as PP#1027, PP#1078 and PP#2116) was 66, 54 and 50% by mass. The E glass cloth content in the prepregs was 34, 46 and 50% by mass.

Examples 1 to 3 and Comparative Examples 1 to 3

As a glass film, prepared here were a glass film having a thickness of 50 μm, "product name OA-10G" (by Nippon Electric Glass, 250 mm×250 mm) and a glass film having a thickness of 100 μm, "product name OA-10G" (by Nippon Electric Glass, 250 mm×250 mm) (these may be referred to as GF-50 μm and GF-100 μm).

The above-mentioned glass film and the above-mentioned prepreg were put one upon another as shown in Table 2, and then an electrolytic copper foil having a thickness of 12 μm was arranged on and below these, and pressed under a pressure of 3.0 MPa at a temperature of 235° C. for 120 minutes to give a copper-clad laminate plate.

Example 4

Production of Varnish for Non-Fiber Resin Composition Layer, Containing Thermosetting Resin Composition To 135.4 parts of a polyamide resin, Nippon Kayaku's "BPAM-155" (product name) dissolved in a dimethylacetamide solvent to have a concentration of 10%, added were 62.0 parts of an epoxy resin, Nippon Kayaku's "NC3000-C" (product name, concentration 100%) as a thermosetting resin, 23.5 parts of a triazine-containing phenolic novolak resin, DIC's "LA-1356-60P" (product name, concentration 60%) as a curing agent, 0.6 parts of 2-phenylimidazole, Shikoku Chemical Industry's "2PZ" (product name, concentration 100%) as a curing promoter, 4.8 parts of fumed silica, Nippon Aerosil's "AEROSIL R972" (product name, concentration 100%) as an inorganic filler, and 1.7 parts of a polyester-modified polydimethylsiloxane, BYK Chemie Japan's "BYK-310" (product name, concentration 25%) as an other component; and further, 66.3 parts of a dimethylacetamide solvent was added thereto. These were processed with a disperser (Nanomizer, Yoshida Kikai's product, name) to give a uniform resin varnish.

<Production of Adhesive Film 3 (Support Film 1/Resin Composition Layer 2)>

The resin composition layer 2 was formed on the support film 1 to give an adhesive film 3. The method is as follows: Using a comma coater, the varnish for non-fiber resin composition layer was applied on the release-treated side of a release-treated polyethylene terephthalate (PET) film (PET-38X, by Lintec, product name) serving as a support film in such a manner that the thickness thereof after dried could be 20 μm, and then dried at 140° C. for 5 minutes thereby producing the adhesive film 3 comprising the resin composition layer 2 and the support film 1 and having a width of 270 mm (FIG. 1(a)).

<Production of Laminate Plate (Non-Fiber Cured Resin Layer/Glass Substrate Layer/Fiber-Containing Cured Resin Layer/Glass Substrate Layer/Non-Fiber Cured Resin Layer)>

As the glass substrate layer 4, used here was an ultrathin glass film, Nippon Electric Glass's "OA-10G" (product name, thickness 50 μm; 250 mm×250 mm). The above-mentioned prepreg (PP#1078) 5 and glass substrate layer 4 were put one upon another in an order of glass substrate layer/prepreg (PP#1078)/glass substrate layer, and laminated using a batch-type vacuum pressure laminator "MVLP-500" (Meiki's product name) (FIG. 1(b)). In this stage, the vacuum degree was at most 30 mmHg, the temperature was 140° C., and the pressure was 0.5 MPa. The laminate body was heated in a nitrogen atmosphere at 235° C. for 120 minutes, whereupon the resin in the prepreg cured to be a fiber-containing cured resin, thereby giving the laminate plate 6 of glass substrate layer/fiber-containing cured resin layer/glass substrate layer (FIG. 1(c)). Next, the adhesive film 3 was arranged on and below the laminate plate 6 in such a manner that the resin composition layer 2 of the adhesive film 3 could face the glass substrate layer 4 of the laminate plate 6, and laminated using a batch-type vacuum pressure laminator "MVLP-500" (Meiki's product name) (FIG. 1(d)). In this stage, the vacuum degree was at most 30 mmHg, the temperature was 120° C., and the pressure was 0.5 MPa. Accordingly, the resin composition layer 2 changed to the cured resin layer 2a. After cooled to room temperature, the support film was peeled off, and this was cured in dry atmosphere at 180° C. for 60 minutes to give a 5-layered laminate plate 7 (non-fiber cured resin layer/glass substrate layer/fiber-containing cured resin layer/glass substrate layer/non-fiber cured resin layer) (FIG. 1(e)).

[Measurement]

The laminate plates obtained in the above-mentioned Examples and Comparative Example were analyzed and evaluated for the properties thereof, according to the methods mentioned below.

(1) Measurement of Thermal Expansion Coefficient

A test piece of 4 mm×30 mm was cut out of the laminate plate. In case where a copper-clad laminate plate is tested, the plate was dipped in a copper etching solution to remove the copper foil, and thereafter the test piece was cut out of it.

Using a TMA tester (by DuPont, TMA2940), the thermal expansion behavior of the test piece at lower than Tg was observed and evaluated. Concretely, the test piece was heated at a heating rate of 5° C./min, then within a measurement range of from 20 to 200° C. in the 1st run, and from −10 to 280° C. in the 2nd run, this was analyzed according to a tensile method under a load of 5 g and with a chuck distance of 10 mm. The mean thermal expansion coefficient of the sample within a range of from 50 to 120° C. and within a range of from 120 to 190° C. was determined. The results are shown in Table 2.

(2) Measurement of Storage Elastic Modulus

A test piece of 5 mm×30 mm was cut out of the laminate plate. In case where a copper-clad laminate plate is tested, the plate was dipped in a copper etching solution to remove the copper foil, and thereafter the test piece was cut out of it.

Using a wide-area viscoelasticity meter (Rheology's DVE-V4 Model), the test piece was analyzed for the storage elastic modulus at 40° C. with a span distance of 20 mm, at a frequency of 10 Hz and under the condition of a vibration displacement of from 1 to 3 μm (stop excitation). The results are shown in Table 2.

TABLE 2

| Sample | Glass Ratio | Thermal Expansion Coefficient (ppm/° C.) | | Elastic Modulus (GPa) |
|---|---|---|---|---|
| Configuration | (% by volume) | 50-120° C. | 120-190° C. | 40° C. |
| Example 1 GF 50 μm<br>PP #2116: 100 μm<br>GF 50 μm<br>PP #2116: 100 μm<br>GF 50 μm | 43 | 5.5 | 4.8 | 27.7 |
| Example 2 GF 50 μm<br>PP #2116: 100 μm<br>GF 50 μm | 50 | 4.5 | 4.2 | 39.1 |
| Example 3 GF 50 μm<br>PP #1078: 50 μm<br>GF 50 μm | 67 | 4.4 | 4.2 | 43.7 |

TABLE 2-continued

| Sample | Configuration | Glass Ratio (% by volume) | Thermal Expansion Coefficient (ppm/° C.) 50-120° C. | Thermal Expansion Coefficient (ppm/° C.) 120-190° C. | Elastic Modulus (GPa) 40° C. |
|---|---|---|---|---|---|
| Example 4 | cured resin layer 20 μm<br>GF 50 μm<br>PP #1078: 50 μm<br>GF 50 μm<br>cured resin layer 20 μm | 53 | 4.6 | 4.8 | 39.7 |
| Comparative Example 1 | PP #2116: 100 μm<br>PP #2116: 100 μm<br>PP #2116: 100 μm | 0 | 13.1 | 15.3 | 24.7 |
| Comparative Example 2 | PP #1078: 50 μm<br>GF 100 μm<br>PP #1078: 50 μm | 50 | 6.1 | 5.8 | 35.7 |
| Comparative Example 3 | PP #1027: 30 μm<br>GF 100 μm<br>PP #1027: 30 μm | 63 | 5.2 | 5.3 | 41.7 |

As obvious from Table 2, Examples 1 to 3 of the present invention containing a glass film have a low thermal expansion coefficient at 50 to 120° C. and have a high elastic modulus at 40° C., as compared with Comparative Example 1 not containing a glass film. In addition, it is known that, within a high-temperature range of from 120 to 190° C., the thermal expansion coefficient of Comparative Example 1 was higher than that in a low-temperature range (50 to 120° C.), however, Examples 1 to 4 have low thermal expansivity on the same level both in the high-temperature range and in the low-temperature range. Accordingly, Examples 1 to 4 of the present invention maintain low thermal expansivity not only in a low-temperature range but also in a high-temperature range.

Example 2 and Comparative Example 2 in which the glass ratio was 50% by volume are compared with each other. Example 2 having a glass film as the outermost layer is better than Comparative Example 2 in point of all the low thermal expansivity at 50 to 120° C., the low thermal expansivity at 120 to 190° C. and the high elasticity at 40° C.

Similarly, Example 3 and Comparative Example 3 in which the glass ratio was nearly on the same level are compared with each other. Example 3 having a glass film as the outermost layer is better than Comparative Example 3 in point of all the low thermal expansivity at 50 to 120° C., the low thermal expansivity at 120 to 190° C. and the high elasticity at 40° C.

DESCRIPTION OF REFERENCE NUMERALS AND SIGNS

1 Support Film
2 Resin Composition Layer
2a Non-Fiber Cured Resin Layer
3 Resin Film
4 Glass Substrate Layer
5 Prepreg
5a Fiber-Containing Cured Resin Layer
6 Laminate Plate (intermediate)
7 Laminate Plate

The invention claimed is:

1. A laminate body containing one or more resin composition layers and two or more glass substrate layers, wherein:
at least one layer of those one or more resin composition layers is a fiber-containing resin composition layer of a fiber-containing resin composition that contains a thermosetting resin and a fibrous base material, and
at least one layer of those resin composition layers exists between any two layers of the glass substrate layers.

2. The laminate body according to claim 1, wherein the thickness of the glass substrate layer is from 30 to 200 μm.

3. The laminate body according to claim 1, wherein, of those two or more glass substrate layers, the glass substrate layer on the outermost surface side and the glass substrate layer on the outermost back side exist on the more surface side and on the more back side, respectively, than all the resin composition layers.

4. The laminate body according to claim 1, wherein:
those one or more resin composition layers include a first resin composition layer facing the surface of the glass substrate layer on the outermost surface side, and a second resin composition layer facing the back of the glass substrate layer on the outermost back side, and
the first resin composition layer and the second resin composition layer each are a non-fiber organic composition layer of a non-fiber organic composition that contains a thermosetting resin but does not contain a fibrous base material.

5. The laminate body according to claim 4, wherein the first resin composition layer and the second resin composition layer each have a thickness of from 3 to 40 μm.

6. The laminate body according to claim 1, wherein the fiber-containing resin composition layer contains an inorganic filler.

7. The laminate body according to claim 6, wherein the inorganic filler is one or more selected from silica, alumina, talc, mica, aluminium hydroxide, magnesium hydroxide, calcium carbonate, aluminium borate and borosilicate glass.

8. The laminate body according to claim 1, wherein the fibrous base material is one or more selected from glass fibers, polyimide fibers, polyester fibers and polytetrafluoroethylene fibers.

9. The laminate body according to claim 1, wherein the thermosetting resin is one or more selected from an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin.

10. A laminate plate containing one or more cured resin layers and two or more glass substrate layers, wherein:

at least one layer of those one or more cured resin layers is a fiber-containing cured resin layer of a cured product of a fiber-containing resin composition that contains a thermosetting resin and a fibrous base material, and at least one layer of those cured resin layers exists between any two layers of the glass substrate layers.

11. The laminate plate according to claim 10, which has a storage elastic modulus at 40° C. of from 10 GPa to 70 GPa.

12. The laminate plate according to claim 10, which is obtained by heating a laminate body containing one or more resin composition layers and two or more glass substrate layers, wherein:

at least one layer of those one or more resin composition layers is a fiber-containing resin composition layer of the fiber-containing resin composition that contains the thermosetting resin and the fibrous base material, and at least one layer of those resin composition layers exists between any two layers of the glass substrate layers.

13. A multilayer laminate plate containing multiple laminate plates, wherein:

at least one laminate plate is the laminate plate of claim 10.

14. A printed wiring board having the laminate plate of claim 10 and a wiring provided on the surface of the laminate plate.

15. A printed wiring board having the multilayer laminate plate of claim 13 and a wiring provided on the surface of the multilayer laminate plate.

16. A method for producing a laminate plate of claim 10, which comprises a cured resin layer forming step of forming a cured resin layer on the surface of a glass substrate.

17. The method for producing a laminate plate according to claim 16, wherein the cured resin layer forming step is a step of laminating a film of the resin composition onto the glass substrate by the use of a vacuum laminator or a roll laminator, followed by curing the film.

18. The method for producing a laminate plate according to claim 16, wherein the cured resin layer forming step is a step of arranging a film of the resin composition onto the glass substrate followed by pressing and curing the film.

* * * * *